(12) United States Patent
Stahr et al.

(10) Patent No.: US 10,861,636 B2
(45) Date of Patent: Dec. 8, 2020

(54) INDUCTOR MADE OF COMPONENT CARRIER MATERIAL COMPRISING ELECTRICALLY CONDUCTIVE PLATE STRUCTURES

(71) Applicant: AT&S Austria Technologie & Systemtechnik Aktiengesellschaft, Leoben (AT)

(72) Inventors: Johannes Stahr, St.Lorenzen (AT); Gerald Weidinger, Leoben (AT); Heinz Moitzi, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 101 days.

(21) Appl. No.: 15/851,177

(22) Filed: Dec. 21, 2017

(65) Prior Publication Data
US 2018/0182532 A1    Jun. 28, 2018

(30) Foreign Application Priority Data

Dec. 22, 2016 (EP) ..................... 16206372

(51) Int. Cl.
| H01F 27/28 | (2006.01) |
| H01F 41/04 | (2006.01) |
| H01F 17/00 | (2006.01) |
| H01F 27/24 | (2006.01) |
| H05K 1/18 | (2006.01) |

(52) U.S. Cl.
CPC ..... *H01F 27/2804* (2013.01); *H01F 17/0013* (2013.01); *H01F 27/24* (2013.01); *H01F 27/2847* (2013.01); *H01F 41/041* (2013.01); *H01F 41/042* (2013.01); *H01F 41/046* (2013.01); *H01F 17/0033* (2013.01); *H05K 1/181* (2013.01); *H05K 1/185* (2013.01); *H05K 2201/1003* (2013.01)

(58) Field of Classification Search
CPC ................. H01F 27/2804; H01F 27/24; H01F 2027/2809
USPC .................................. 336/200, 232
See application file for complete search history.

(56) References Cited

U.S. PATENT DOCUMENTS

| 6,252,486 B1 | 6/2001 | Wolf | |
| 2007/0085648 A1* | 4/2007 | Lee | H01F 17/0033 336/200 |

(Continued)

FOREIGN PATENT DOCUMENTS

| CN | 1064368 A | 9/1992 |
| CN | 102647854 A | 8/2012 |

(Continued)

OTHER PUBLICATIONS

Office Action in Application 201711407725.2, dated Mar. 21, 2019, State Intellectual Property Office of P.R. China, Beijing, China, pp. 1-9.

(Continued)

*Primary Examiner* — Tszfung J Chan
(74) *Attorney, Agent, or Firm* — Robert A. Blaha; Smith Tempel Blaha LLC

(57) ABSTRACT

An inductor component includes a plurality of stacked layer structures made of component carrier material with electrically conductive plate structures, and a plurality of electrically conductive interconnect structures connecting the electrically conductive plate structures to thereby form an inductance with multiple windings.

15 Claims, 3 Drawing Sheets

(56) References Cited

U.S. PATENT DOCUMENTS

| | | | |
|---|---|---|---|
| 2008/0136574 A1 | 6/2008 | Jow et al. | |
| 2011/0272094 A1 | 11/2011 | Dalmia et al. | |
| 2014/0034373 A1* | 2/2014 | Yoshikawa | H01F 5/003 174/260 |
| 2014/0043131 A1 | 2/2014 | Dalmia et al. | |
| 2014/0091892 A1* | 4/2014 | Tominaga | H05K 1/165 336/200 |
| 2014/0159851 A1* | 6/2014 | Mano | H01F 27/2804 336/200 |
| 2014/0176383 A1* | 6/2014 | Yosui | H01Q 7/08 343/788 |
| 2015/0235753 A1* | 8/2015 | Chatani | H01F 17/0013 336/200 |

FOREIGN PATENT DOCUMENTS

| | | |
|---|---|---|
| CN | 104603889 A | 5/2015 |
| CN | 105359233 A | 2/2016 |
| CN | 106113849 A | 11/2016 |
| DE | 10 2012 220 022 A1 | 5/2014 |
| EP | 0 522 475 A1 | 1/1993 |
| EP | 0 919 064 B1 | 6/2003 |
| EP | 2 109 867 A2 | 7/2008 |
| EP | 2 107 577 A1 | 10/2016 |
| FR | 2874123 B1 | 5/2011 |
| JP | 2006294927 A * | 10/2006 |
| JP | 2014229739 A * | 12/2014 |
| WO | WO 2007038309 A2 | 4/2007 |
| WO | WO 2010065113 A1 | 6/2010 |
| WO | WO 2014164925 A1 | 10/2014 |

OTHER PUBLICATIONS

Second Office Action in Application No. 201711407725.2, dated Feb. 7, 2020; pp. 1-3; China National Intellectual Property Adminstration; Beijing, China.

* cited by examiner

INDUCTOR MADE OF COMPONENT CARRIER MATERIAL COMPRISING ELECTRICALLY CONDUCTIVE PLATE STRUCTURES

CROSS-REFERENCE TO RELATED APPLICATION

This application claims the benefit of the filing date of the European Patent Application No. EP 16 206 372.1 filed 22 Dec. 2016, the disclosure of which is hereby incorporated herein by reference.

TECHNICAL FIELD

Embodiments of the invention relate to an inductor component, a component carrier, a method of manufacturing an inductor component, and a method of manufacturing a component carrier.

TECHNOLOGICAL BACKGROUND

In the context of growing product functionalities of component carriers equipped with one or more components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, mounting devices shall be mechanically robust so as to be operable even under harsh conditions.

It is known to integrate an inductor in a printed circuit board. However, conventional approaches suffer from high electrical losses.

SUMMARY

There may be a need to provide an inductor component for component carrier applications with low electrical losses.

According to embodiments of the invention, an inductor component, a component carrier, a method of manufacturing an inductor component, and a method of manufacturing a component carrier according to the independent claims are provided.

According to an exemplary embodiment of the invention, an inductor component is provided, wherein the inductor component comprises a plurality of stacked layer structures made of component carrier material (such as printed circuit board (PCB) material, for instance copper, resin and/or reinforcing particles, wherein the latter may be embodied as prepreg and/or a glass fiber epoxy laminate commonly known as FR4) and comprising electrically conductive plate structures, and a plurality of electrically conductive interconnect structures connecting the electrically conductive plate structures to thereby form an inductance with multiple windings.

According to another exemplary embodiment of the invention, a component carrier is provided which comprises a stack comprising at least one electrically conductive layer structure and/or at least one electrically insulating layer structure, and an inductor component having the above mentioned features embedded in or surface mounted on the stack.

According to another exemplary embodiment of the invention, a method of manufacturing an inductor component is provided, wherein the method comprises stacking a plurality of layer structures made of component carrier material and comprising electrically conductive plate structures, and connecting the electrically conductive plate structures by a plurality of electrically conductive interconnect structures to thereby form an inductance with multiple windings.

According to still another exemplary embodiment of the invention, a method of manufacturing a component carrier is provided, wherein the method comprises interconnecting a stack of at least one electrically conductive layer structure and at least one electrically insulating layer structure, and embedding an inductor component which is configured according to the above-mentioned features and/or is manufactured by a method having the above-mentioned features in the stack.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In the context of the present application, the term "inductor component" may particularly denote a standalone electronic member which provides an inductance in the framework of an electronic application in which the inductor component is implemented. The inductor component may be formed on the basis of component carrier technology, in particular on the basis of printed circuit board (PCB) technology, and may be surface-mounted or embedded in a separately formed or in an integrally formed component carrier such as a PCB. However, the inductor component can also be used in conjunction with non-component carrier applications.

In the context of the present application, the term "electrically conductive plate structure" may particularly denote a massive (rather than tiny) electrically conductive plate element with a thickness higher than conventional electrically conductive layers (such as thin copper foils) used for printed circuit board technology. In particular, the electrically conductive plate structures may have a thickness and rigidity which does not allow the electrically conductive plate structure to be easily folded, and in particular may allow bending of the electrically conductive plate structure only to a very limited extent. For example, the electrically conductive plate structure may be made on the basis of a metallic sheet or plate with a thickness of at least 300 μm.

In the context of the present application, the term "winding" may particularly denote a loop structure (which may be similar to a helical structure with corners), wherein multiple of such loops may form a coil-type arrangement. However, due to the component carrier manufacturing technology (for instance involving lamination) of the inductor component and/or due to the used component carrier raw materials (for instance involving planar constituents such as plates and foils), the windings of the quasi-coil structure may have edge-like or corner-like portions rather than being limited to a composition of multiple interconnected purely circular structures.

According to an embodiment of the invention, an inductor component and a corresponding component carrier are provided which can be manufactured in a simple way by using component carrier manufacturing processes. However, contrary to typical layer thicknesses of copper foils (for instance in the range between few micrometers to few tens of micrometers) used for manufacturing conventional component carriers such as printed circuit boards (PCB), exemplary embodiments of the invention increment significantly thicker electrically conductive plate structures for constituting an electrically conductive winding functioning as an inductance. By taking this measure, not only high inductance values and a high carrying current capability is enabled, but it is also made possible that signals are propagating along the inductor structure with only low electrical loss. Furthermore, such a low loss or low ohmic transport of electric signals along the windings of the inductor component has the additional advantage that ohmic heat generated during such a process may be kept low. Remaining small amounts of heat generated by ohmic losses nevertheless can be dissipated from an interior of the inductor component to a periphery via the use of electrically insulating material having a sufficiently high thermal conductivity, as conventionally used component carrier materials. For example, materials such as prepreg or FR4 may be used for that purpose, as known from PCB technology. By using relatively thick (compared to ordinary PCB copper foil thicknesses) and robust electrically conductive plate structures rather than very thin metal foils for manufacturing the inductor component, an inductor component with high metal filling factor may be obtained which results in a high Q-factor and a robust but at the same time compact design.

In the following, further exemplary embodiments of the inductor component, the component carrier and the methods will be explained.

In an embodiment, an electronic component is provided which is composed of the inductor component and at least one further electronic element (which may be realized as two separate members or as one integral member). For instance, a transformer component may be provided which is composed of two cooperating inductor components of the above described type which are connected to a common shared soft magnetic (for instance ferrite) core structure. Thus, the term "inductor component" does not exclude that such a component provides one or more further electronic function in addition to the provision of an inductance.

In an embodiment, the plurality of electrically conductive interconnect structures comprise at least one of the group consisting of vertical interconnect structures (which may be aligned perpendicular to the electrically conductive plate structures), inclined interconnect structures, and horizontal interconnect structures (which may be aligned parallel to the electrically conductive plate structures). For instance, such interconnect structures of one or more of the mentioned geometric orientations may connect portions of the electrically conductive plate structures above and beneath so as to complete formation of the windings. Such an embodiment can be implemented for example when the electrically conductive plate structures are coplanar electrically conductive strips (compare for instance FIG. 2 to FIG. 8), but also when the electrically conductive plate structures are multilayer structures (compare for instance FIG. 9 to FIG. 12).

In an embodiment, the inductance is formed as a coil structure with multiple windings aligned along a common central axis (around which the windings may be arranged) and defined by the interconnect structures and the connected electrically conductive plate structures. The windings may comprise edges (for instance may have a substantially rectangular cross-section) or may be continuously curved (for instance may have a substantially circular cross-section). Arranging the windings along a common central axis allows to obtain a compact configuration with a high inductance value.

In an embodiment, an electrically conductive material filling factor (in particular copper filling factor) of the inductor component, defined as a ratio between a partial volume of electrically conductive material of the inductor component and a total volume of the inductor component (i.e. the partial volume of electrically conductive material plus the partial volume of electrically insulating material of the inductor component), is at least 50%, in particular is at least 80%, more particularly is at least 90%. This allows to obtain an inductor member with a low ohmic configuration and a high Q-factor. In this context, the term Q-factor may denote a dimensionless parameter that describes how underdamped an inductance-based oscillator or resonator is and characterizes a resonator's bandwidth relative to its center frequency.

In an embodiment, the electrically conductive plate structures have a thickness of at least 200 μm, in particular of at least 400 μm. The thickness may even by 1 mm or more. With such high thicknesses of the electrically conductive plate structures, a transport of electric signals with low ohmic loss and small amount of generated heat may be combined with a high inductance value.

In an embodiment, the interconnect structures comprise at least one of the group consisting of metal filled vias and metallic inlays. The mentioned vias may be manufactured by drilling holes in the stack of layer structures (for instance by laser drilling or mechanical drilling) and subsequently filling the holes (which may later connect different electrically conductive plate structures at different layer levels) by filling the holes with electrically conductive material (such as copper), for instance by plating. The filling of the holes with electrically conductive material may be accomplished fully or partially. It is for instance possible to cover the walls of a corresponding drill hole with a layer of an electrically conductive material (such as a lining of copper). It is then optionally possible to fill the remaining void volume of the drill hole partially or completely with a metallic paste (for instance a copper paste). In particular with deep drill holes this procedure may be simpler and more reliable than a complete filling of such holes with galvanic copper only. In contrast to this, the configuration of at least part of the interconnect structures from inlays may involve readily formed electrically conductive blocks (for instance shaped like a post or a bar) which are inserted into holes of the stacked layer structures. In particular with the use of bulky inlays, the ohmic resistance of the windings can be further reduced. Also the formation of sufficiently large via holes and their subsequent filling with low ohmic material such as copper allows to keep the inductance high and the electric resistance sufficiently small.

In an embodiment, a space between the electrically conductive plate structures and the interconnect structures is filled at least partially by electrically insulating material. Such an electrically insulating material keeps the structures forming the windings reliably spaced, thereby preventing undesired electric paths or short-circuiting. At the same time, such electrically insulating material contributes to the mechanical stability of the formed inductor component and can be made of a sufficiently thermally conductive material removing heat generated during propagation of the signals along the windings in use of the inductor component. For instance, the electrically insulating material may have a thermal conductivity of at least 0.5 W/mK, in particular of at least 2 W/mK.

In an embodiment, the inductor component comprises a magnetic structure, in particular a magnetically soft structure (for instance a ferrite structure), in at least part of a space delimited by the electrically conductive plate structures and the interconnect structures. Such a ferrite structure or other magnetized or magnetizable structure increasing the magnetic permeability may be integrated in the stacked layer structures. This allows to increase the performance of the inductor component without significantly complicating the manufacturing procedure. For instance, various layers may simply be stacked and interconnected to one another by lamination, i.e. the application of heat and/or pressure.

In an embodiment, the magnetic structure is configured as a planar layer. This allows to obtain a flat compact inductor component with a high value of the magnetic permeability. For instance, the magnetic structure may be configured as one of the group consisting of a magnetic inlay (which may be readily manufactured when inserted between the electrically conductive plate structures) and printed magnetic paste (which may be printed at a desired position of the inductor component).

In an embodiment, at least one of the electrically conductive plate structures comprises a plurality of (in particular coplanar) separate strips (see for instance FIG. 2 to FIG. 8). The coplanar strips of one electrically conductive plate structure may be aligned within one plane and may be arranged juxtaposed to one another without direct contact. These strips may be formed based on an electrically conductive plate with slits, wherein a connecting frame defining an outer perimeter of such a plate may be removed from the remainder of the inductor component under manufacture after having interconnected (in particular laminated) the plurality of stacked layer structures. This approach combines a simple manufacturing process with a low ohmic inductor component.

In an embodiment, separate strips of two opposing electrically conductive plate structures are pivoted relative to one another (in particular within a plane of the respective electrically conductive plate structure). In other words, a first electrically conductive plate with strips aligned along a first direction may be combined with a parallel second electrically conductive plate having strips aligned along a second direction, wherein the second direction may enclose an angle, in particular an acute angle, with the first direction. For example, such an acute angle may be in a range between 5° and 40°, in particular between 10° and 30°. Such a mutual pivoting of the strips (and corresponding slits spacing the strips) significantly simplifies the formation of interconnected (in particular quasi-helical) windings, since this only requires the connection of the mutually slanted strips by interconnect structures.

In an embodiment, a width of the strips is larger than a width of a gap between adjacent strips. This design rule allows to obtain a compact configuration with a nevertheless low ohmic property and a high metal filling factor.

In an embodiment, at least one of the electrically conductive plate structures comprises a multi-layer structure (in particularly one or more multi-layer blocks) with an alternating sequence of a plurality of electrically conductive plate sections and electrically insulating layer sections (compare FIG. 9 to FIG. 12). For instance, such a multi-layer structure may be implemented as an alternative or substitute for a respective one of the above mentioned strips. It is also possible that multiple multi-layer structures are combined so as to form at least part of the windings. According to such an embodiment, an electrically conductive plate structure can be formed based on a layer sequence of alternating electrically conductive plates (or layers) and electrically insulating layers which may be separated into various longitudinal bars, which may be further separated into small multi-layer blocks. Also such an embodiment allows to manufacture the constituents of the inductor component with low effort and allows for a low ohmic configuration with a high copper content.

In an embodiment, different multi-layer structures are pivoted relative to one another (so that the stacking direction of different multi-layer structures to be connected may be different, enabling the formation of bent or curved windings or portions thereof). Hence, this also allows to construct curved structures with the combination of multiple multi-layer structures (at least some of which may have a non-cuboid shape).

In an embodiment, a thickness of each of the electrically conductive plate sections of the multi-layer structure is larger than a thickness of each of the electrically insulating layer sections. This allows to obtain a high metal filling factor, a low ohmic resistance and an inductor component with a high Q-factor while also ensuring proper electric isolation properties.

In an embodiment, a thickness ratio between a thickness of a respective one of the electrically conductive plate sections and a thickness of the electrically insulating layer sections of the multi-layer structure is at least 2, in particular is at least 4, more particularly is at least 7. For instance, a thickness of an electrically conductive plate section may be in a range between 300 μm and 500 μm, whereas a thickness of an electrically insulating layer section may be in a range between 30 μm and 100 μm. This ensures at the same time a reliable electric isolation while simultaneously obtaining a high metal filling factor.

In an embodiment, the component carrier material comprises or consists of copper and resin with reinforcing fibers. Therefore, conventional standard processes known from PCB technology can be implemented for manufacturing the inductor component with low effort. Copper and resin with reinforcing fibers are typical constituents of PCBs.

In an embodiment, at least one of the electrically conductive plate structures and the interconnect structures comprise at least one of the group consisting of copper, aluminum, nickel, silver, gold, palladium, and tungsten, any of the mentioned materials being optionally coated with supraconductive material such as graphene. Although copper is usually preferred, other materials or coated versions thereof are possible as well, in particular coated with supra-conductive material such as graphene.

In an embodiment, electrically insulating material of the stacked layer structures comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented as an electrically insulating layer structure.

In an embodiment, a thickness of each of the electrically conductive plate structures is larger than a thickness of electrically insulating material between the electrically conductive plate structures. In particular, a thickness ratio between a thickness of a respective one of the electrically conductive plate structures and a thickness of the electrically insulating material may be at least 2, in particular at least 4, more particularly at least 7. This ensures to obtain a particularly low ohmic inductor component with a high Q-factor and a compact design.

In an embodiment, the inductor component comprises an electrically conductive contact structure at an exterior surface of the inductor component electrically contacting at least one of the interconnect structures. In addition to the electrically conductive plate structures and the interconnect structures, it is possible to arrange, at the surface of the coil, an electrically conductive contact structure which may electrically contact the individual interconnect structures. For instance, the electrically conductive contact structure is configured as one of the group consisting of at least one metal inlay and a patterned galvanic metal layer. Such an electrically conductive cover of the coil allows to additionally increase the copper filling factor.

In an embodiment, a stacking direction of the stack is parallel to a stacking direction of the stacked layer structures (compare for instance FIG. 2 to FIG. 8). In such a configuration, embedding of an inductor component into the stack of electrically conductive layer structures and electrically insulating layer structures of the component carrier may be accomplished by a board-in-board architecture, in which a recess may be formed in the mentioned stack and the readily manufactured inductor component is embedded. Alternatively, also a direct lamination of the mentioned stack with an inductor component mounted thereon is possible.

In another embodiment, a stacking direction of the stack is different from, in particular is perpendicular and/or slanted to, a stacking direction of the stacked layer structures (compare for instance FIG. 9 to FIG. 12). Such an embodiment is particularly advantageous with the above described configuration of the multi-layer structures and may result from the above mentioned pivoting.

In an embodiment of the method of manufacturing an inductor component, at least one of the electrically conductive plate structures is formed by providing a plate with integrally connected strips, interconnecting the plate with the other layer structures, and subsequently removing part of the material of the plate to thereby separate the strips from one another. By taking this measure, the two parallel plates with mutually pivoted or rotated strips can be simply interconnected by lamination with a dielectric material in between, and simplified handling. Subsequently, a surrounding frame of the plates, which frame temporarily connects the various strips of each respective plate, can be removed (for instance by punching, cutting, milling, laser processing, etc.) so that the strips of a respective plate are separated but remain within one and the same plane, thereby forming an electrically conductive plate structure. Electrically connecting these strips with interconnect structures then allows to complete a winding constituting the inductance, or to connect neighbored windings to form a coil.

In an embodiment of the method of manufacturing an inductor component, at least one of the electrically conductive plate structures is formed by forming (in particular by laminating) an interconnected body of a plurality of alternating electrically conductive plates and electrically insulating layers, and separating the body into a plurality of multi-layer structures. Such an interconnected body may be manufactured with very low effort as a semi-finished product used as a constituent for manufacturing the inductor component. For manufacturing corresponding multi-layer structures (such as blocks), it is sufficient to simply laminate an alternative sequence of copper plates or sheets and dielectric layers together and to separate the obtained plate-like body into multi-layer structures. These multi-layer structures can be used as constituents for (partially or completely) forming the windings of the inductor component.

In an embodiment of the method of manufacturing a component carrier, the method comprises providing the stack with a cavity and inserting the inductor component into the cavity. Such a cavity may be a blind hole in component carrier material (for instance formed using an embedded release layer and cutting out a piece of the component carrier material above the release layer). Alternatively, the cavity may be a through hole in component carrier material which can be temporarily closed by a temporary carrier (for instance a sticky tape, for example on a rigid plate or a flexible film). The temporary carrier may be removed from the rest of the component carrier before completing its manufacture.

In an embodiment of the method of manufacturing a component carrier, the method comprises interconnecting (in particular laminating) at least one further electrically insulating layer structure and/or at least one further electrically conductive layer structure with the stack and the inductor component embedded in the cavity. During such a lamination procedure, which may be initiated by the supply of mechanical pressure and/or heat, at least partially uncured material (such as prepreg) may be re-melted, then re-solidified and thereby cured. After such a lamination, the inductor component is safely embedded within an interior of the component carrier and may be kept in place by the now cured material.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

It is possible to embed or surface mount at least one further component in or on the component carrier. Such a further component may functionally cooperate with the embedded or surface mounted inductor component. For instance, such an additional component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other additional components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the additional component may also be a further component carrier, for example in a board-in-board configuration. The additional component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
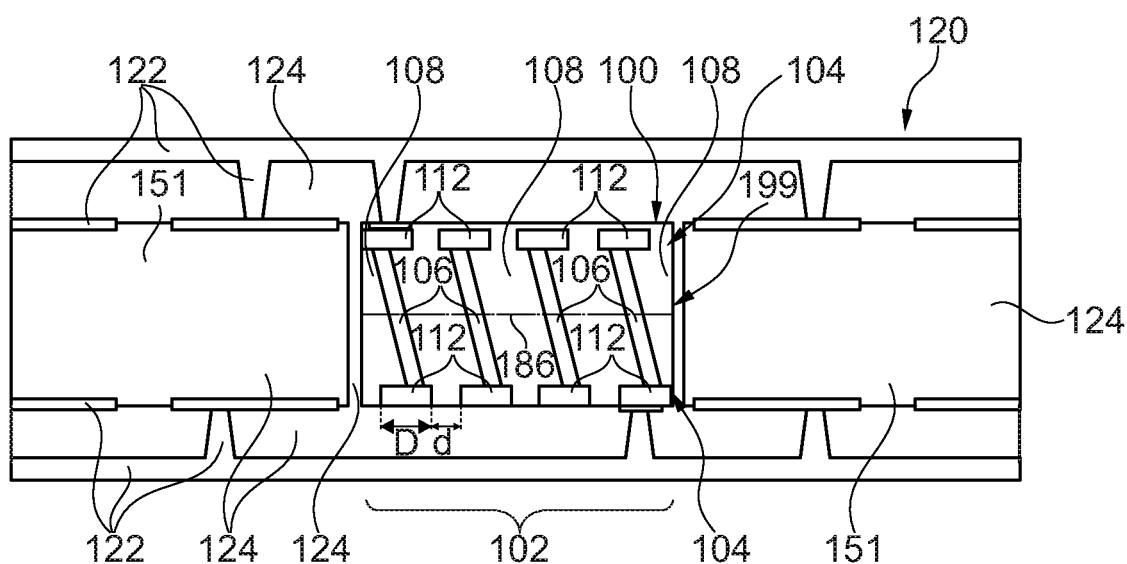
FIG. 1 shows a cross-sectional view of a component carrier with an embedded inductor component according to an exemplary embodiment of the invention.

Embodiments of the present invention are now described and illustrated in the accompanying drawings. The invention is not restricted to the described or illustrated example embodiments.

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

According to an exemplary embodiment of the invention, an embedded inductor architecture making use of component carrier technology is provided.

In order to obtain inductors or coil-like structures with a high Q-factor, it has turned out to be necessary to have an as high metallic (in particular copper) content as possible. In other words, a high metal filling factor of a PCB-based inductor component is desired. As a result of such a high metal filling factor, the ohmic resistance may be reduced and electric losses may be suppressed. Exemplary embodiments of the invention allow to increase the copper filling factor due to the implementation of thick (in particular non-foldable) electrically conductive plate structures rather than thin copper foils patterned by etching technology.

According to an exemplary embodiment of the invention, such electrically conductive plate structures may be provided as pre-formed copper elements which, as a result of their manufacturing process, can be provided with a very high copper content and with a pronounced thickness. Such electrically conductive plate structures may be positioned relatively close to one another by lamination technology.

With the mentioned manufacturing architecture, the electrically conductive structures in the plane of carrying electric current may be placed very close to one another. This increases the copper filling factor of the inductor component. For example, a copper filling factor of at least 90%, in particular of at least 95% may be achieved. This increases the coil quality Q of the inductor component. Upon formation of interconnect structures for connecting the mentioned electrically conductive plate structures in a vertical or z-direction (and/or extending horizontally and/or slanted with regard to both the horizontal and the vertical direction), also the copper filling factor in vertical direction can be rendered very high, in particular at least 90%, more particularly at least 95%.

Conventional thin copper foils of small thickness patterned by etching require a very small thickness in order to be patternable by etching. Due to this limitation, the copper filling factor of such conventional inductor structures is quite small, rendering electric losses high and the Q-factor low. Exemplary embodiments of the invention overcome such limitations by making a paradigm shift in terms of PCB technology, i.e. implementing (for instance punched or laminated) electrically conductive plate structures with high copper filling factor, low ohmic properties and high Q-factor. A further advantage of exemplary embodiments of the invention is that, when copper inlays are implemented as interconnect structures, no significant topology occurs, resulting in flat and compact inductor components, which are consequently highly appropriate in terms of being embedded itself in a component carrier. The described manufacturing technology of exemplary embodiments of the invention is compatible with very different inductor shapes, such as ring coils, longitudinal coils, double longitudinal coils, etc.

Conductive plate structures arranged in different layers may be accomplished by copper filled bores. For example, these structures may for instance be vertically arranged copper filled bores or through connections for coupling various sections of two or more electrically conductive plate structures arranged in different layers. The impact on the manufactured coil is then low, since the distance over the core is usually larger than the bores through the thin intermediate layer(s). It is however also possible to interconnect electrically conductive layer structures by copper inlays, which additionally increases the metal filling factor.

The manufactured coil can be equipped with a soft magnetic or magnetizable structure such as a ferrite core. Such a core may be embodied as another inlay, may be embedded, or may even be printed by a magnetic paste. Such a soft magnetic material may be made of ferrite, or any other permanent magnetic material, etc. It is however alternatively also possible to configure the inductor component as air coil, i.e. without ferrite core. Copper layers or plate structures may be provided with a thickness of for example 400 μm or more. In contrast to this, one or more electrically insulating layers (for instance made of prepreg material) between the electrically conductive plate structures may have a smaller thickness than the electrically conductive plate structures, for instance may have a thickness of 50 μm or less. Thereby, the copper filling factor may be rendered very high.

In a highly preferred exemplary embodiment, slitted copper sheets may be implemented for forming the electrically conductive plate structures (see FIG. 2 to FIG. 8). By taking this measure, a coil with a very high copper filling factor may be manufactured. In a corresponding embodiment, two slitted (more precisely multi-slitted) copper sheets are interconnected with or without a ferrite layer in between. The slits may be formed by a laser cutting procedure, so that the slits can be rendered very small as compared to the remaining webs or strips between adjacent slits. This additionally increases the copper filling factor. After having interconnected the electrically conductive plate structures with the optional ferrite layer in between and with optional dielectric material in between, the obtained compound may be milled (or treated with another abrasive procedure) to separate the strips and remove the previously connecting frame. The connection between the upper and the lower coil layer (provided by the two electrically conductive plate structures) can be manufactured as copper filled bores or using copper inlays. Optionally it is possible to cover the surface of the coil with a galvanic copper layer (or any other electrically conductive contract structure) in order to ensure the electric contacting of the horizontal and vertical copper inlays. This copper layer can be subsequently formed with the coil design of the upper and lower conductive layers (i.e. two electrically conductive plate structures).

In another preferred embodiment (see FIG. 9 to FIG. 12), the electrically conductive plate structures may be formed based on a semi-finished product embodied as a layer sequence of copper foils (for instance having a thickness of 400 μm or more) and dielectric layers in between (for instance having a thickness of 50 μm or less). Such a layer stack, which may be interconnected by lamination, may be cut into separate bars or blocks (also denoted as laminar structures or multi-layer sections or multi-layer blocks), which may be subsequently cut to a desired length. As a result, coil elements with a high copper content are formed, which also provide a reliable electric isolation. The obtained multi-layer sections may be rotated by an appropriate angle (for instance 90°) and may then be embedded in component carrier material. Thereby, it is possible to obtain an inductor component according to an exemplary embodiment of the invention. The multi-layer sections may constitute the electrically conductive plate structures, optionally they may additionally also (partially or entirely) form the interconnect structures.

Inductor components manufactured according to exemplary embodiments of the invention may be used in addition to one or more embedded and/or surface mounted (for instance active and/or passive electronic) components in a component carrier. Inductor components according to exemplary embodiments of the invention furthermore allow the manufacture of transformers, voltage converters and other electronic members, in particular for high voltage applications. This allows to obtain an even higher degree of integration.

FIG. 1 shows a cross-sectional view of a component carrier 120 with an embedded inductor component 100 according to an exemplary embodiment of the invention.

The component carrier 120, which is here embodied as a printed circuit board (PCB) with embedded inductor component 100, comprises a stack of a plurality of electrically conductive layer structures 122 and a plurality of electrically insulating layer structures 124. In the shown embodiment, the electrically insulating layer structures 124 are layers comprising resin and reinforcing fibers therein. More precisely, the exterior electrically insulating layer structures 124 may be made of prepreg or FR4, i.e. may be made based on an epoxy resin filled with reinforcing for glass fibers. The vertically most central one of these layers is cut so as to define a through hole, recess or cavity 199 in which the inductor component 100 is embedded. The vertically most central one of the electrically insulating layer structures 124 is a core 151 of fully cured material, which may for instance be made of FR4 material. The other electrically insulating layer structures 124 are substantially continuous layers through which vertical interconnect structures (forming part of the electrically conductive layer structures 122) are formed for electrically contacting the inductor component 100. In the shown embodiment, the electrically conductive layer structures 122 comprise patterned copper foils, continuous copper foils and vertical interconnect structures embodied as copper filled vias.

As can be taken from FIG. 1, the inductor component 100 is embedded within the described stack rather than being surface mounted on an exterior surface of the component carrier 120. Alternatively, it is also possible to surface mount the inductor component 100 on the component carrier 120.

In the shown embodiment, the inductor component 100 comprises itself a further laminated stack, i.e. a plurality of stacked layer structures 102 made of component carrier material. Such component carrier material may be material used for printed circuit boards (PCBs) or IC substrates such as copper, epoxy resin and glass fibers.

In particular, the inductor component 100 shown in FIG. 1 comprises two parallel and vertically spaced electrically conductive plate structures 104 which are here configured as isolated sections of a previously integral copper plate (see reference numeral 130 in FIG. 2) having a thickness of 0.5 mm. Both electrically conductive plate structures 104 are patterned so as to form a plurality of coplanar separate strips 112. In each of the electrically conductive plate structures 104, the plurality of parallel separate strips 112 are separated by electrically insulating material 108 to ensure reliable electric isolation between adjacent strips 112 (forming part of adjacent windings of the coil-like inductance). A horizontal width, D, of the strips 112 is larger than a width, d, of a horizontal gap 114 between adjacent strips 112 so that a high copper filling factor and therefore a high Q-factor is obtained.

Beyond this, FIG. 1 shows that the inductor component 100 comprises a plurality of (here inclined, alternatively vertical and/or horizontal) interconnect structures 106 electrically connecting or coupling the electrically conductive plate structures 104 to thereby form windings of the coil. Although not shown in FIG. 1, the inductor component 100 furthermore comprises a plurality of other interconnect structures 106 connecting the electrically conductive plate structures 104 in another plane than the paper plane of FIG. 1 to thereby complete formation of the multiple interconnected windings, i.e. a coil-like structure. The interconnect structures 106 may be configured as metal filled vias and/or as metallic inlays. As can be taken from FIG. 1 as well, a space between the electrically conductive plate structures 104 and the interconnect structures 106 is filled by electrically insulating material 108 such as resin and reinforcing fibers.

As can be taken from FIG. 1, a (here vertical) stacking direction of the stack of layer structures 122, 124 is parallel to a (here also vertical) stacking direction of the stacked layer structures 102. This geometry simplifies interconnection of the various elements of the component carrier 120 by lamination, i.e. the application of heat and/or mechanical pressure.

A recess in the core 151, which defines the cavity 199, is filled with the inductor component 100 as described. The plurality of electrically conductive layer structures 122 and electrically insulating layer structures 124 may be laminated on both opposing main surfaces of the core 151 with embedded inductor component 100. The lamination procedure for manufacturing such a component carrier 120 with embedded inductor component 100 may use initially at least partially uncured dielectric material such as B-stage resin which may cross-link upon lamination. The embedded architecture according to FIG. 1 results in a highly compact component carrier 120 with embedded inductor component 100. During the described lamination procedure, a gap of the cavity 199 between the stack and the inserted inductor component 100 may be filled with re-melted and subsequently re-solidified material of the electrically insulating layer structures 124. Additionally or alternatively, it is also possible to fill any remaining gap of the cavity 199 between the stack and the inserted inductor component 100 with an additional filling medium, such as a liquid resin. This may be in particular advantageous when the resin material of the prepreg sheet(s) of the electrically insulating layer structure(s) 124 is not sufficient for completely filling the gap during lamination.

For manufacturing the component carrier 120 shown in FIG. 1, the core 151 with its central through hole may be connected to a temporary carrier such as a sticky tape (not shown). The inductor component 100 may then be placed within a cavity 199 delimited by the through hole and, at the bottom thereof, by the sticky tape. One or more electrically conductive layer structures 122 and one or more electrically insulating layer structures 124 may then be placed on an upper surface of the so obtained structure and may be interconnected by lamination, i.e. by the application of heat and pressure. Subsequently, the temporary carrier may be removed from that now sufficiently rigid structure. On the lower main surface and/or at the upper main surface of the so obtained structure, it is possible to further attach one or more electrically conductive layer structures 122 and one or more electrically insulating layer structures 124 and interconnect them by lamination. The vertical interconnect structures 106 can be formed by laser drilling followed by a copper plating procedure.

According to FIG. 1, the inductance is formed as a coil structure with multiple substantially rectangular windings aligned along a common central axis (corresponding to a horizontal direction according to FIG. 1 and indicated by a broken line 186 in FIG. 1) and defined by the interconnect structures 106 and the connected electrically conductive plate structures 104.

FIG. 2 to FIG. 8 illustrate different cross-sectional views of structures obtained during carrying out a method of manufacturing an inductor component 100 according to another exemplary embodiment of the invention.

Figure 2:
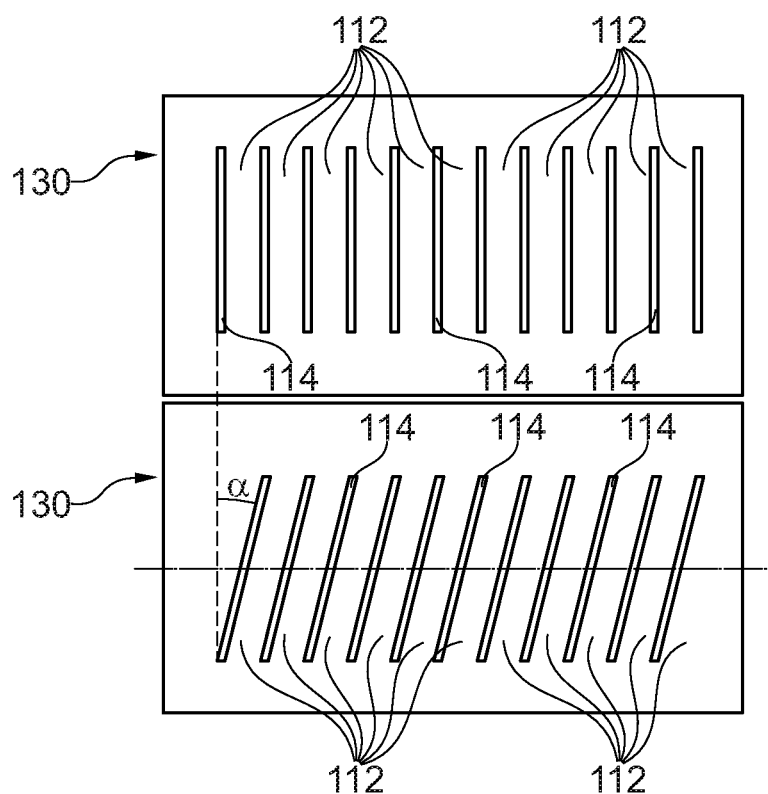
FIG. 2, FIG. 3, FIG. 4, FIG. 5, FIG. 6, FIG. 7 and FIG. 8 illustrate different cross-sectional views of structures obtained during performance of a method of manufacturing an inductor component according to another exemplary embodiment of the invention.

Referring to FIG. 2, two rigid plates 130 of copper are shown in a plan view and are used as a basis for the further manufacturing procedure. The plates 130 may have a thickness of for example 400 µm such that they are not foldable or easily bendable, but form rigid plates. In each of the plates 130, a plurality of coplanar separate strips 112 are formed by drilling, milling, or laser cutting etc., thereby forming a plurality of through holes in the form of parallel slits 114. In the upper plate 130 according to FIG. 2, the slits 114 are formed parallel to the side edges of the upper plate 130. In the lower plate 130 according to FIG. 2, the slits 114 and the strips 112 are formed slanted with regard to the side edges of the lower plate 130. The plates 130 are arranged so as to form two opposing parallel electrically conductive plates 130 having slits 114 being pivoted or rotated relative to one another by an angle α. The angle α may be an acute angle, in particular in a range between 5° and 30°. This ensures that a tight array of windings is formed by the two plates 130 in cooperation with interconnects 106 connecting the strips 112 of the plates 130 for forming quasi-helical windings of the coil under manufacture. FIG. 2 hence shows the two plates 130 as a semi-finished product for manufacturing electrically conductive plate structures 104 for an inductor component 100.

Figure 3:
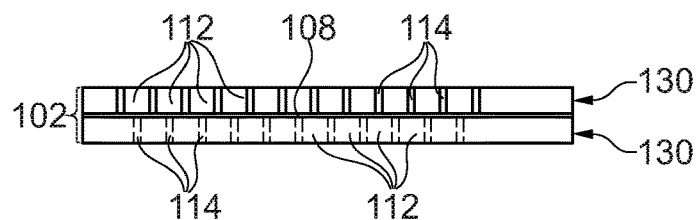

Referring to FIG. 3, the plates 130 according to FIG. 2 are stacked with an electrically insulating material 108 in between. Thus, according to FIG. 3, a plurality of layer structures 102 made of component carrier material and comprising preforms of electrically conductive plate structures 104, i.e. the plates 130, are stacked. FIG. 3 shows a side view of the plates 130 according to FIG. 2 being sandwiched with a thin electrically insulating layer as electrically insulating material 108 in between. The electrically insulating material 108 may have a significantly smaller thickness (for instance 50 µm) as compared to the plates 130.

Figure 4:
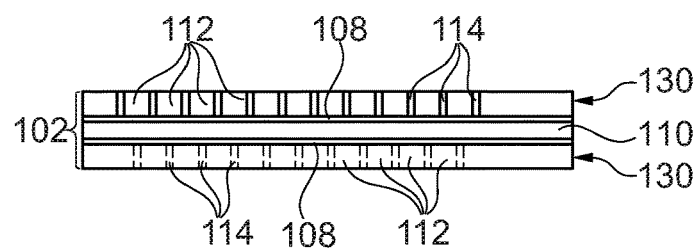

Referring to FIG. 4, an alternative structure compared to FIG. 3 is shown which comprises additionally a planar layer-type soft magnetic structure 110 made of a magnetically soft material such as ferrite in a space between the slitted plates 130. Thus, in contrast to FIG. 3 showing an air coil configuration, FIG. 4 shows a side view of a ferrite coil configuration with the soft magnetic structure 110 in between. For example, the magnetic structure 110 is configured as a magnetic inlay or a printed magnetic paste.

Figure 5:
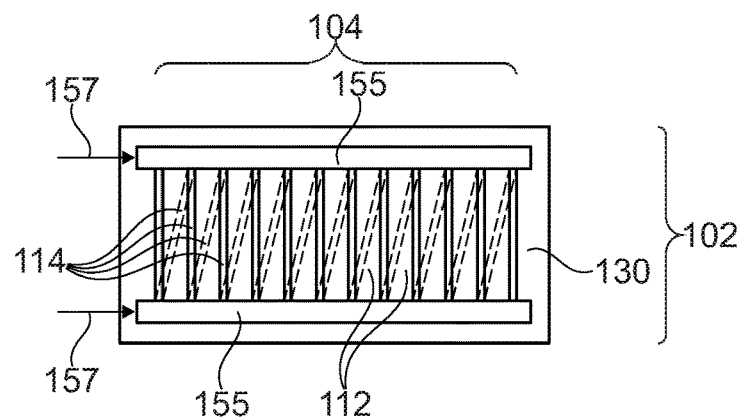

Referring to FIG. 5, a plan view of the structure shown in FIG. 3 or alternatively in FIG. 4 is illustrated. It can be taken from FIG. 5 how the electrically conductive plate structures 104 are formed based on the respective plates 130. More precisely and starting from FIG. 3 or FIG. 4, the electrically conductive plate structures 104 are formed by providing the respective plates 130 with the still integrally connected strips 112. After interconnection according to FIG. 3 or FIG. 4, part of the material of the plates 130 is subsequently removed to thereby separate the strips 112 from one another in each of the plates 130. For this purpose, two parallel recesses 155 are milled in the plates 113. This material removal procedure may be carried out along a direction 157. Thus, FIG. 5 shows a plan view of the structures of FIG. 3 or FIG. 4 and shows how recesses 155 are formed in the plates 130 shown in FIG. 2 by milling or the like. This separates the various strips 112 from one another.

FIG. 6 again shows a plan view of the structure of FIG. 5, wherein copper inlays are now formed as vertical interconnect structures 106. The separated or isolated strips 112 of the vertically spaced and relatively turned electrically conductive plate structures 104 may thereby be connected by forming a plurality of the here vertical interconnect structures 106 to form multiple windings of the inductor coil. The interconnect structures 106 thus interconnect the strips 112 of the two opposing electrically conductive plate structures 104, thereby forming windings of a coil providing the inductor structure 100 under manufacture.

Figure 6:
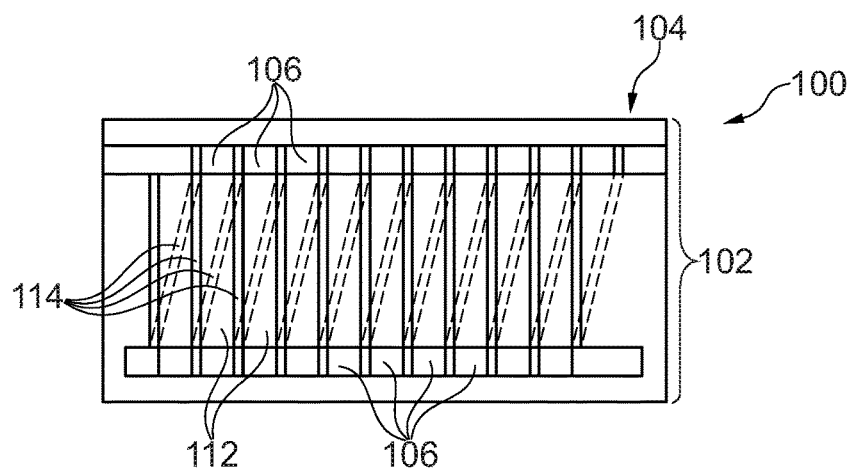
Figure 7:
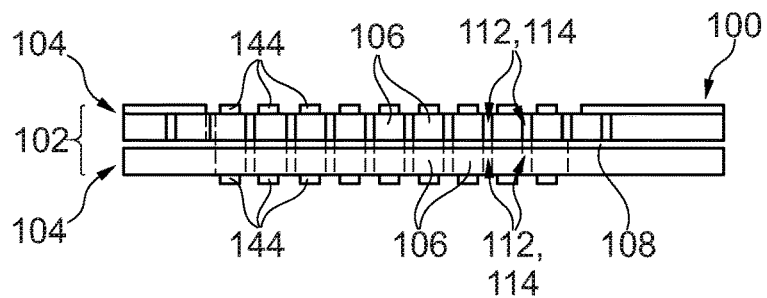
Figure 8:
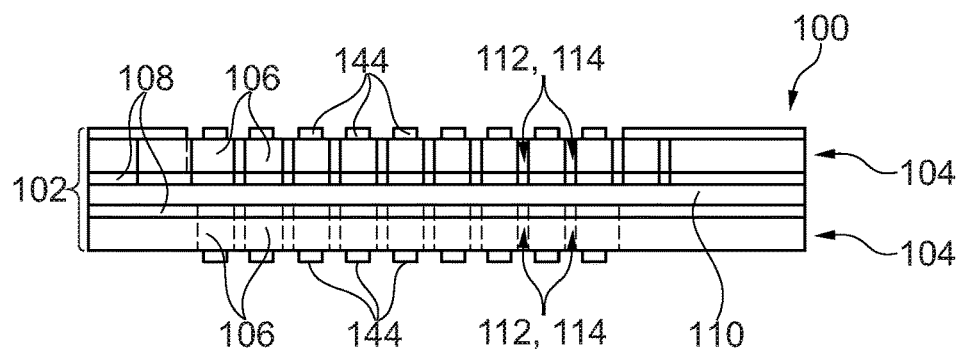

FIG. 7 shows, after a further processing step, a side view of the structure according to FIG. 6 in an embodiment of an air coil (compare FIG. 3). In contrast to this, FIG. 8 shows a side view of a structure corresponding FIG. 6, after a further processing step, with a ferrite coil configuration (compare FIG. 4). As can be taken from FIG. 7, the inductor component 100 furthermore comprises an electrically conductive contact structure 144 formed at an exterior surface of the inductor component 100 electrically contacting the interconnect structures 106. This formation corresponds to the mentioned further processing step. The electrically conductive contact structure 144 may be configured as metal inlay or as patterned galvanic metal layer.

FIG. 9 to FIG. 12 illustrate different cross-sectional views of structures obtained during carrying out a method of manufacturing an inductor component 100 according to yet another exemplary embodiment of the invention.

Figure 9:
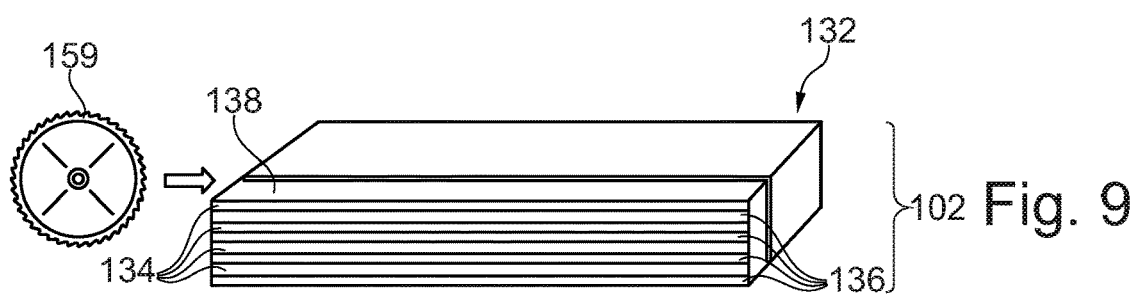
FIG. 9, FIG. 10, FIG. 11 and FIG. 12 illustrate different cross-sectional views of structures obtained during performance of a method of manufacturing an inductor component according to yet another exemplary embodiment of the invention.

Referring to FIG. 9, a preform of electrically conductive plate structures 104 are formed by laminating an interconnected body 132 of a plurality of alternating electrically conductive plates 134 (here embodied as copper plates with a thickness of 400 µm) and electrically insulating layers 136 (here embodied as prepreg foils having a thickness of 50 µm). Thereafter, the interconnected body 132 may be separated into a plurality of parallel bars 138. A cutting wheel 159 cuts the interconnected body 132 into the separate bars 138. FIG. 9 therefore shows a laminar structure or layer sequence of electrically conductive plates 134 and electrically insulating layers 136 interconnected by lamination, i.e. the application of pressure and/or heat.

Figure 10:
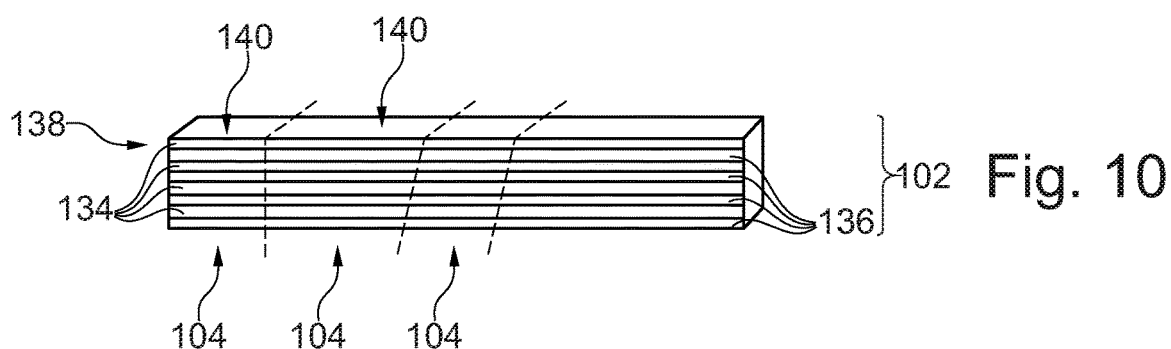
Figure 11:
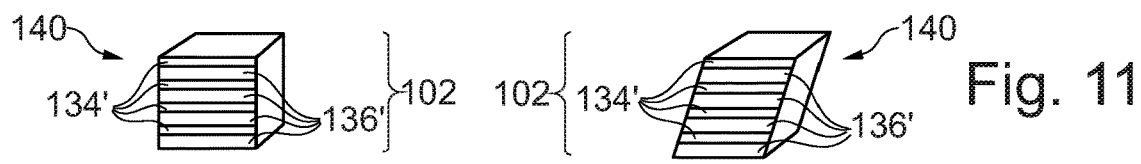
Figure 12:
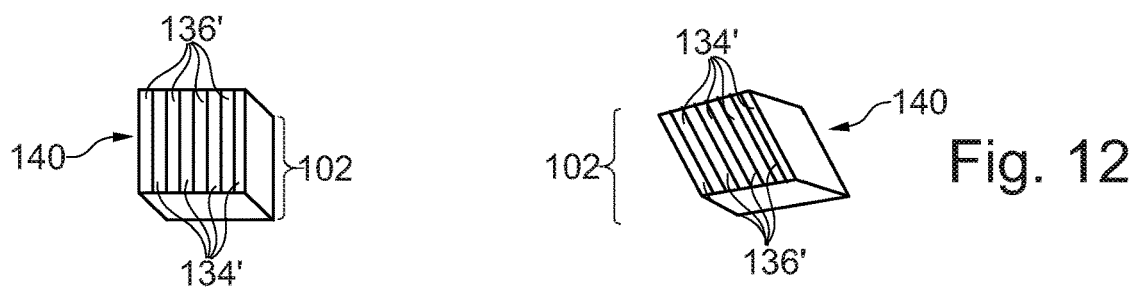

FIG. 10 shows a single bar 138 which may be used as a constituent for an inductor coil (i.e. as electrically conductive plate structure 104 or interconnect structure 106). The bar 138 can however also be further separated into a plurality of multi-layer structures 140, which may also be denoted as multi-layer blocks. Thus, the bars 138 may be cut into smaller pieces of appropriate size and shape, for instance cuboids, as shown in FIG. 11 and FIG. 12. The multi-layer structures 140 may also be rotated prior to connecting them for the formation of a coil structure. Thus, the multi-layer structures 140 may be used as constituents of the electrically conductive plate structures 104. They may also be used for interconnect structures 106. However, electrically conductive plate structures 104 formed on the basis of multi-layer structures 140 may also combined with interconnect structures 106 formed on the basis of metal filled vias or inlays, as in FIG. 2 to FIG. 8.

Still referring to FIG. 11 and FIG. 12, each of the multi-layer structures 140 is composed of an alternating sequence of a plurality of electrically conductive plate sections 134' (as sections of the electrically conductive plates 134) and electrically insulating layer sections 136' (as sections of the electrically insulating layers 136). Different multi-layer structures 140 may be pivoted relative to one another or may have a different shape (see FIG. 11). A thickness of each of the electrically conductive plate sections 134' is larger than a thickness of each of the electrically insulating layer sections 136'. By turning the multi-layer structures 140 by 90° (see FIG. 12) before assembling them to an inductor component 100, their stacking direction is rendered perpendicular to a stacking direction of a component carrier 120 (see FIG. 1).

Different multi-layer structures 140 may differ from one another concerning shape and/or size. More specifically, different multi-layer structures 140 may be shaped and dimensioned so that abutting multi-layer structures 140 seamlessly fit to one another to thereby form an inductor component together. For instance, the multi-layer structures 140 may comprise one or more cubes, one or more cuboids, one or more parallelepipeds, and/or one or more three-dimensional bodies having six planar faces at least two opposing of which being not parallel to one another. Other shapes of the multi-layer structures 140 are possible as well as long as they can be assembled to form an inductor component.

It should also be appreciated that the non-cuboid multi-layer structures 140 shown on the right-hand side of FIG. 11 and FIG. 12 are only illustrated exemplarily and schematically. These slopingly cut blocks can also be further modified concerning the shape and/or size. They may also be grinded on one or more of their surfaces so as to fit to correspondingly connected cuboid multi-layer structures 140. Thus, the corresponding illustration in FIG. 11 and FIG. 12 is simplified for the sake of simplicity.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of embodiments of the invention is not limited to the preferred embodiments shown in the figures and described above. Instead, a multiplicity of variants are possible which use the solutions shown and the principle according to embodiments the invention even in the case of fundamentally different embodiments.

The invention claimed is:

1. An inductor component, comprising:
   a plurality of stacked layer structures made of component carrier material and electrically conductive plate structures; and
   a plurality of electrically conductive interconnect structures connecting the electrically conductive plate structures to thereby form an inductance with multiple windings,
   wherein at least one of the electrically conductive plate structures comprises a multi-layer structure with an alternating sequence of a plurality of electrically conductive plate sections and electrically insulating layer sections, and
   wherein a thickness of each of the electrically conductive plate sections is larger than a thickness of each of the electrically insulating layer sections.

2. The inductor component according to claim 1, further comprising at least one of the following features:
   wherein the plurality of electrically conductive interconnect structures comprise at least one of the group consisting of vertical interconnect structures, inclined interconnect structures, and horizontal interconnect structures;
   wherein the inductance is formed as a coil structure with multiple windings aligned along a common central axis and defined by the interconnect structures and the connected electrically conductive plate structures;
   wherein an electrically conductive material filling factor of the inductor component, defined as a ratio between a partial volume of electrically conductive material of the inductor component and a total volume of the inductor component, is at least 50%;
   wherein the electrically conductive plate structures have a thickness of at least 200 µm;
   wherein the interconnect structures comprise at least one of the group consisting of metal filled vias, and metallic inlays;
   wherein a space between the electrically conductive plate structures and the interconnect structures is filled at least partially by electrically insulating material.

3. The inductor component according to claim 1, further comprising:
   a magnetic structure in a space delimited by the electrically conductive plate structures and the interconnect structures.

4. The inductor component according to claim 3, further comprising at least one of the following features:
   wherein the magnetic structure is configured as a planar layer;
   wherein the magnetic structure is configured as one of the group consisting of a magnetic inlay and printed magnetic paste.

5. The inductor component according to claim 1, wherein at least one of the electrically conductive plate structures comprises a plurality of separate strips.

6. The inductor component according to claim 5, further comprising at least one of the following features:
   wherein coplanar separate strips of two opposing electrically conductive plate structures are positioned in parallel planes;
   wherein separate strips of two opposing electrically conductive plate structures are pivoted relative to one another;
   wherein a width of the strips is larger than a gap between adjacent strips of a respective one of the electrically conductive plate structures.

7. The inductor component according to claim 1, wherein different multi-layer structures are pivoted relative to one another.

8. The inductor component according to claim 1, further comprising at least one of the following features:
   wherein the component carrier material comprises or consists of copper and resin;
   wherein a thickness of each of the electrically conductive plate structures is larger than a thickness of electrically insulating material between the electrically conductive plate structures;

wherein a thickness ratio between a thickness of a respective one of the electrically conductive plate structures and a thickness of the electrically insulating material is at least 2;

an electrically conductive contact structure at an exterior surface of the inductor component electrically contacting at least one of the interconnect structures, wherein the electrically conductive contact structure is configured as one of the group consisting of at least one metal inlay and a patterned galvanic metal layer.

9. The inductor component according to claim 1, wherein a thickness ratio between a thickness of a respective one of the electrically conductive plate sections and a thickness of the electrically insulating layer sections is at least 2.

10. The inductor component according to claim 1, wherein a thickness ratio between a thickness of a respective one of the electrically conductive plate sections and a thickness of the electrically insulating layer sections is at least 4.

11. A component carrier, configured as one of the group consisting of a printed circuit board and a substrate, the component carrier, comprising:

a stack having at least one electrically conductive layer structure and/or at least one electrically insulating layer structure; and an inductor component embedded in or surface mounted on the stack, the inductor component having
a plurality of stacked layer structures made of component carrier material and electrically conductive plate structures; and
a plurality of electrically conductive interconnect structures connecting the electrically conductive plate structures to thereby form an inductance with multiple windings, wherein at least one of the electrically conductive plate structures comprises a multi-layer structure with an alternating sequence of a plurality of electrically conductive plate sections and electrically insulating layer sections, and wherein a thickness of each of the electrically conductive plate sections is larger than a thickness of each of the electrically insulating layer sections.

12. The component carrier according to claim 11, further comprising one of the following features:

wherein a stacking direction of the stack is parallel to a stacking direction of the stacked layer structures;

wherein a stacking direction of the stack is different from a stacking direction of the stacked layer structures.

13. The component carrier according to claim 11, wherein a stacking direction of the stack is perpendicular or slanted to a stacking direction of the stacked layer structures.

14. A method of manufacturing an inductor component, the method comprising:

stacking a plurality of layer structures made of component carrier material and electrically conductive plate structures; and connecting the electrically conductive plate structures by a plurality of electrically conductive interconnect structures to thereby form an inductance with multiple windings, wherein at least one of the electrically conductive plate structures comprises a multi-layer structure with an alternating sequence of a plurality of electrically conductive plate sections and electrically insulating layer sections, and wherein a thickness of each of the electrically conductive plate sections is larger than a thickness of each of the electrically insulating layer sections.

15. The method according to claim 14, further comprising one of the following features:

wherein at least one of the electrically conductive plate structures is formed by providing a plate with integrally connected strips, interconnecting the plate with the other layer structures, and subsequently removing part of the material of the plate to thereby separate the strips from one another;

wherein at least one of the electrically conductive plate structures is formed by forming an interconnected body of a plurality of alternating electrically conductive plates and electrically insulating layers, separating the body into a plurality of bars, and separating the bars into a plurality of multi-layer structures.

* * * * *